(12) United States Patent
Bogner et al.

(10) Patent No.: US 8,227,821 B2
(45) Date of Patent: Jul. 24, 2012

(54) HOUSING FOR AN OPTOELECTRONIC COMPONENT, OPTOELECTRONIC COMPONENT AND METHOD FOR THE PRODUCTION OF AN OPTOELECTRONIC COMPONENT

(75) Inventors: Georg Bogner, Lappersdorf (DE);
Herbert Brunner, Sinzing (DE);
Michael Hiegler, Mutlangen (DE);
Günter Waitl, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 751 days.

(21) Appl. No.: 11/575,705

(22) PCT Filed: Sep. 20, 2005

(86) PCT No.: PCT/DE2005/001654
§ 371 (c)(1),
(2), (4) Date: Oct. 30, 2007

(87) PCT Pub. No.: WO2006/032251
PCT Pub. Date: Mar. 30, 2006

(65) Prior Publication Data
US 2008/0265266 A1    Oct. 30, 2008

(30) Foreign Application Priority Data
Sep. 22, 2004    (DE) .................. 10 2004 045 950

(51) Int. Cl.
*H01L 33/00* (2010.01)
(52) U.S. Cl. ..... 257/98; 257/99; 257/100; 257/E33.061; 438/27; 438/26
(58) Field of Classification Search ............. 257/97, 257/98, 99, 100, E33.061, E33.067; 438/22, 438/25, 26, 27, 29
See application file for complete search history.

(56) References Cited

U.S. PATENT DOCUMENTS

| | | | |
|---|---|---|---|
| 4,173,476 A | 11/1979 | Olofson et al. | |
| 4,727,457 A | 2/1988 | Thillays | |
| 5,043,716 A | 8/1991 | Latz et al. | |
| 5,450,513 A | 9/1995 | Bookbinder et al. | |
| 5,998,925 A * | 12/1999 | Shimizu et al. | 313/503 |
| 6,066,861 A | 5/2000 | Höhn et al. | |
| 6,344,244 B1 | 2/2002 | Schrof et al. | |

(Continued)

FOREIGN PATENT DOCUMENTS

CN    2540685    3/2003

(Continued)

OTHER PUBLICATIONS

Office Action for Chinese Patent Application No. 200580031203.6 dated Dec. 11, 2009.

(Continued)

*Primary Examiner* — Thinh T Nguyen
(74) *Attorney, Agent, or Firm* — Fish & Richardson P.C.

(57) ABSTRACT

A housing for an optoelectronic component which includes a carrier with a chip mounting surface is disclosed. An optical element which is produced separately from the carrier is applied to the carrier. The chip mounting surface and the optical element define a parting plane, the parting plane between carrier and optical element being arranged in the plane of the chip mounting surface. Also disclosed is an optoelectronic component having a housing of this type and a method for producing an optoelectronic component of this type.

11 Claims, 2 Drawing Sheets

U.S. PATENT DOCUMENTS

| | | | |
|---|---|---|---|
| 6,355,946 B1* | 3/2002 | Ishinaga | 257/98 |
| 6,396,082 B1* | 5/2002 | Fukasawa et al. | 257/79 |
| 6,498,355 B1* | 12/2002 | Harrah et al. | 257/99 |
| 6,642,547 B2* | 11/2003 | Matsubara et al. | 257/98 |
| 2001/0042865 A1 | 11/2001 | Oshio et al. | |
| 2002/0105268 A1 | 8/2002 | Schliep et al. | |
| 2002/0145152 A1 | 10/2002 | Shimomura | |
| 2002/0190637 A1* | 12/2002 | Matsubara et al. | 313/503 |
| 2003/0008431 A1* | 1/2003 | Matsubara et al. | 438/98 |
| 2003/0025117 A1 | 2/2003 | Isokawa et al. | |
| 2003/0116769 A1 | 6/2003 | Song et al. | |
| 2003/0168720 A1 | 9/2003 | Kamada | |
| 2003/0218811 A1* | 11/2003 | Fukasawa | 359/853 |
| 2004/0047151 A1 | 3/2004 | Bogner et al. | |
| 2004/0066140 A1 | 4/2004 | Omoto | |
| 2004/0075100 A1 | 4/2004 | Bogner et al. | |
| 2004/0240229 A1* | 12/2004 | Blumel et al. | 362/555 |
| 2004/0264185 A1 | 12/2004 | Grotsch et al. | |

FOREIGN PATENT DOCUMENTS

| | | |
|---|---|---|
| DE | 2904626 | 8/1979 |
| DE | 8812039.2 | 2/1989 |
| DE | 19755734 | 6/1999 |
| DE | 19851139 | 5/2000 |
| DE | 19918370 | 11/2000 |
| DE | 10041328 | 3/2002 |
| DE | 10122002 | 11/2002 |
| DE | 10319274 | 12/2004 |
| EP | 0 616 376 | 9/1994 |
| EP | 0 635 744 | 1/1995 |
| EP | 0 886 322 | 12/1998 |
| EP | 0911886 | 4/1999 |
| EP | 1 011 151 | 6/2000 |
| EP | 1 119058 | 7/2001 |
| EP | 1 249 875 | 10/2002 |
| EP | 1 367 413 | 12/2003 |
| JP | 62060277 | 3/1987 |
| JP | 04010670 | 1/1992 |
| JP | 5-44955 | 6/1993 |
| JP | 6-302857 | 10/1994 |
| JP | 9-27643 | 1/1997 |
| JP | 9-83018 | 3/1997 |
| JP | 11-103040 | 4/1999 |
| JP | 2000111721 | 4/2000 |
| JP | 2001-007392 | 1/2001 |
| JP | 2002-228621 | 8/2002 |
| JP | 2002-314139 | 10/2002 |
| JP | 2002-324918 | 11/2002 |
| JP | 2003-60238 | 2/2003 |
| JP | 2003-249691 | 9/2003 |
| JP | 2003-534668 | 11/2003 |
| JP | 2004-103775 | 4/2004 |
| JP | 2004-128393 | 4/2004 |
| JP | 2004-179438 | 6/2004 |
| WO | WO 98/12757 | 3/1998 |
| WO | WO 01/69300 | 9/2001 |
| WO | WO 02/052615 | 4/2002 |
| WO | WO 02/084749 | 10/2002 |

OTHER PUBLICATIONS

Beyer, W., "Lehrbuch der Organischen Chemie" 21. Auflage S. 34, S. Hirzel Verlag, Stuttgart 1988.

Möllmer, F. et al., "Siemens SMT-Topled für die Oderflächenmontage" *Siemens Components*, vol. 29, Heft 5, pp. 193-196; 1991.

Produkt-Information, "Superhelle Leuchtdioden Erobern Neue KFZ-Anwendungen, Power TOPLED Ersetzen Kleinglülampen", *Siemens Components*, vol. 34, Heft 4, S. I-II; 1996.

Schnitzer, I. et al., "30% External Quantum Efficiency from Surface Textured, Thin-film Light-emitting Diodes", *Appl. Phys. Lett.*, vol. 63, No. 16, pp. 2174-2176, 1993.

Authorized officer: Bakos, T., International Search Report, PCT/DE2005/001654, Jan. 27, 2006.

Chinese Office Action dated Mar. 13, 2009.

Office Action for Application No. 200580031203.6, dated May 30, 2008.

Japanese Office Action (English Translation) for Japanese Application No. 2007-531593, dated Mar. 30, 2011 (6 pages).

Japan Patent Office, "Translation of the Final Notification of Reasons for Refusal (type II office action)", JP Pat. Appl. No. 2007-531593, issued on Nov. 4, 2011 (6 pages).

\* cited by examiner

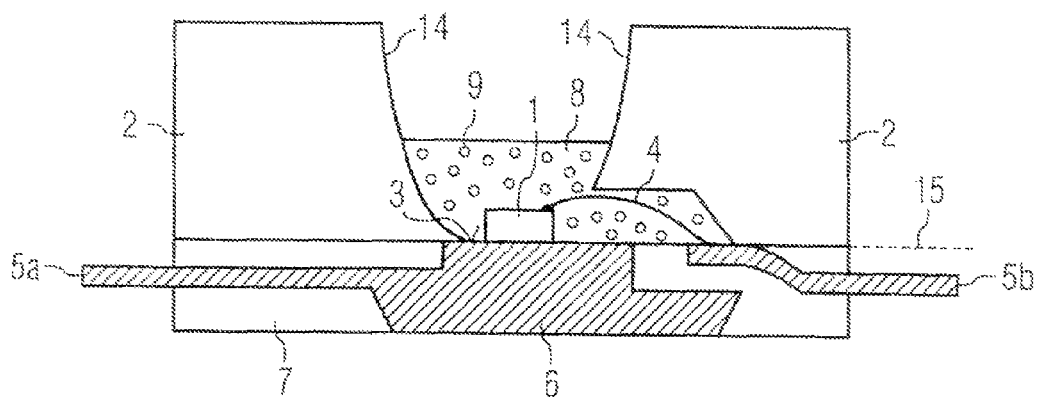
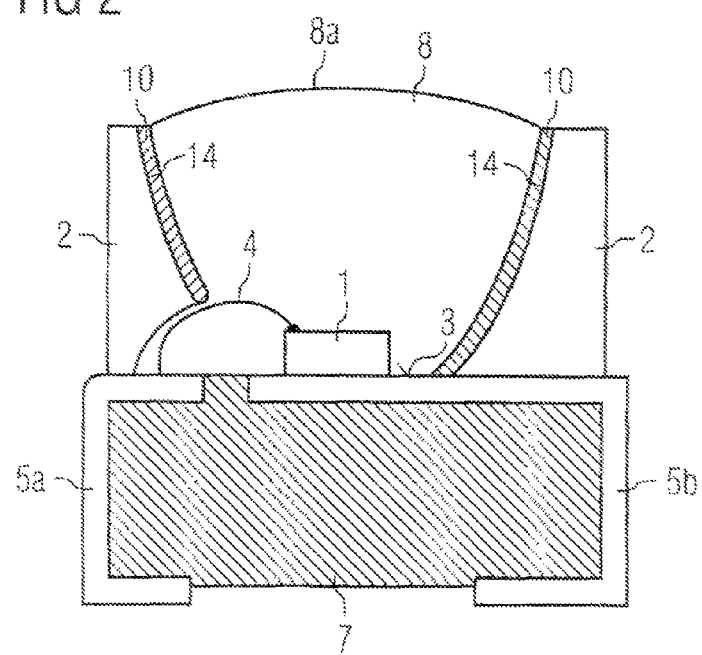

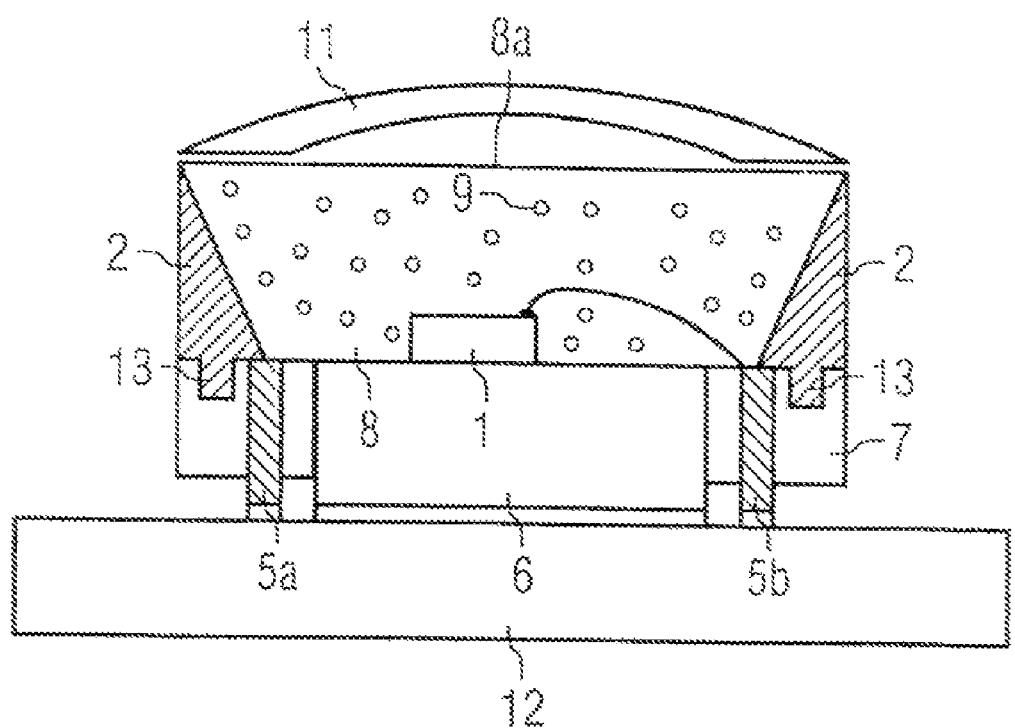

HOUSING FOR AN OPTOELECTRONIC COMPONENT, OPTOELECTRONIC COMPONENT AND METHOD FOR THE PRODUCTION OF AN OPTOELECTRONIC COMPONENT

CROSS-REFERENCE TO RELATED APPLICATIONS

This application is the National Stage of International Application No. PCT/DE2005/001654, filed on Sep. 20, 2005, which claims the priority to German Patent Application Serial No. 10 2004 045 950.9, filed on Sep. 22, 2004. The contents of both applications are hereby incorporated by reference in their entireties.

FIELD OF THE INVENTION

The invention relates to a housing for an optoelectronic component, to an optoelectronic component and to a method for producing an optoelectronic component.

BACKGROUND OF THE INVENTION

Document WO 02/08 47 49 A2 describes a leadframe and a housing, as well as a radiation-emitting component formed using these components. A recess in the form of a radiation exit window is formed in the housing base body, the sidewalls of the radiation exit window forming a reflector.

SUMMARY OF THE INVENTION

It is an object of the present invention to provide a housing for an optoelectronic component which is particularly versatile in use. A further object of the invention is to provide an optoelectronic component having a housing of this type, and a method for producing an optoelectronic component of this type.

The invention discloses a housing for an optoelectronic component. This is preferably a housing for a surface-mountable optoelectronic component.

In at least one embodiment of the housing, the housing includes a carrier with a chip mounting surface. This means that on the carrier there is a surface on which, for example, at least one radiation-emitting or radiation-receiving semiconductor chip can be mounted.

The carrier may, for example, have a base body which contains an electrically insulating material. In this case, patterned interconnects which contain an electrically conductive material are applied to at least parts of the surface of the base body of the carrier. The chip mounting surface is preferably provided by at least part of the surface of the carrier. The chip mounting surface may, for example, be termed by part of the interconnects. A chip which has been applied to the carrier can be electrically contact-connected via the interconnects.

Furthermore, it is preferable for the housing to include an optical element. The optical element is preferably produced separately from the carrier and is mechanically secured to the carrier. The carrier and the optical element adjoined to each other at a parting plane. The parting plane between carrier and optical element is preferably arranged in the plane of the chip mounting surface.

It is preferable for the optical element to at lease partially surround the chip mounting surface. For this purpose, the optical element has, for example, sidewalls which at least partially surround the chip mounting surface.

At least one embodiment describes a housing for an optoelectronic component which includes a carrier with a chip mounting surface and an optical element, the parting plane between carrier and optical element being arranged in the plane of the chip mounting surface.

In this context, the housing makes use of the idea whereby numerous new design options for optoelectronic components, result from the separate construction of carrier and optical element. By way of example, with the same carrier, the radiation output characteristics of the component can be adapted to the requirements in use by selecting a particular optical element. Since carrier and optical element are preferably produced separately, moreover, there are more options for selecting the systems of materials in which carrier and optical element are in each case formed.

The optical element is preferably arranged following the chip mounting surface, in such a manner that, for example, the radiation from a radiation-emitting component applied to the chip mounting surface at least partially impinges upon at least subregions of the optical element.

According to at least one embodiment of the housing, at least part of the optical element is suitable for at least partially reflecting electromagnetic radiation of a specific wavelength region. If sidewalls of the optical element at least partially surround the chip mounting surface, by way of example the inner walls of the optical element, i.e. for example the inner sides of the sidewalls which follow the chip mounting surface, may be suitable for reflecting electromagnetic radiation of a predeterminable wavelength region. The radiation output characteristics of the optical element may, for example, foe determined by the shape of the inner walls of the optical element and the materials which the optical element contains. The optical element is then, for example, a reflector.

For example, in at least one embodiment, the optical element is a non-imaging optical concentrator, in which case the light entry opening of the optical element is the actual light exit opening of the concentrator. The light entry opening is preferably arranged after the chip mounting surface, which means that the optical concentrator narrows towards the chip mounting surface. The cross-sectional area of the optical concentrator in this case decreases in the direction of the chip mounting surface. In this way, the optical element may be suitable for reducing the divergence of a light beam emitted from a radiation-emitting component secured to the chip mounting surface as it passes through the optical element.

According to at least one embodiment, the optical element is at least partially formed in the style of a compound parabolic concentrator (CPC), a compound elliptical concentrator (CEC), a compound hyperbolic concentrator (CHC) or a TIR (total internal reflection) optical system. This means that, for example, inner walls of the optical element which are designed to be reflective and are arranged after the chip mounting region are at least partially formed in the style of a CPC, CEC, CHC, or a TIR. Furthermore, it is possible for the optical element to be formed by a combination of at least two of these optical elements.

According to at least one embodiment, the optical element has inner walls which connect the light entry opening of the optical, element to a light exit opening and run substantially in a straight line. The inner walls of the optical element form, for example, a truncated pyramid or a truncated cone. It is preferable for the inner walls in turn to be made reflective.

In at least one embodiment, the optical element is a dielectric concentrator. At least its sidewalls are then formed from a dielectric material with a suitable refractive index, so chat radiation which enters via the light entry opening is reflected to the surrounding medium by total reflection at the boundary surfaces of the sidewalls or inner walls.

Furthermore, it is possible for the optical element to be a free-form optical system, i.e. the shape of, for example, the inner walls of the optical element arranged after the chip mounting surface is matched to the desired radiation output characteristics of the component. The shape of the inner walls may in this case be determined very accurately, for example, by simulation calculations (for example ray-tracing methods). On account of the separate production of carrier and optical element, it is then particularly easy to produce the calculated optical system.

Moreover, it is possible for the optical element to be a lens, a lens system, or another light-refracting optical system. This means that at least part of the optical element is suitable for refracting radiation which passes through the optical element.

In at least one embodiment, the light exit opening of the optical element is arranged after at least one additional optical element, which is suitable for diffraction, refraction or wavelength conversion of the electromagnetic radiation which emerges from the light exit opening. It is particularly preferable for the additional optical element to perform at least two of these tasks.

According to at least one embodiment, the additional optical element has a light exit surface which, for example, may be spherically or aspherically curved. By way of example, the light exit surface is curved convexly outwards. This makes it possible, for example, to reduce the divergence of the electromagnetic radiation which emerges from the light exit opening of the optical element.

The light exit surface of the additional optical element is preferably curved in the form of an aspherical lens. This means that she light exit opening is an optical surface which is used for diffraction of the emerging light beam and is neither spherical nor planar. An optical element formed in this manner may particularly preferably have a large number of shape parameters, with the result that, for example, it is possible to take into account the size of the radiation emission surface of a radiation-emitting semiconductor chip secured to the chip counting surface. By contrast, spherical lenses are optimum for punctiform light sources and may have significantly poorer properties for non-punctiform light sources, for example in terms of reducing the divergence of the light beam which emerges.

In at least one embodiment of the housing, the optical element contains a reflective material. The reflective material is preferably suitable for reflecting, for example, the electromagnetic radiation generated by a radiation-emitting component which has been applied to the chip mounting surface. For this purpose, the optical element may, for example, contain a plastic into which suitable colour pigments which reflect the radiation emitted by the chip have been introduced. Furthermore, it is possible for the optical element to be formed from a ceramic material. However, the optical element may also be produced from a reflective material by a metal casting process.

Furthermore, the base body of the optical element may, for example, be formed from a non-reflecting material, and the inner walls of the optical element which are arranged after the chip mounting region are provided with a reflective coating. The coating may in this case contain at least one of the following materials: aluminium oxide, aluminium, silicon, silicon dioxide, silicon nitride. The reflective coating can be applied in a defined thickness to the inner walls of the optical element by means of a coating process such as for example pulsed chemical vapour phase epitaxy (PICVD). In this case, the coating does not necessarily cover the entire surface of the inner walls.

Moreover, it is possible for the optical element, by way of example, to be made non-reflective close to its light entry opening. It is in this way possible to prevent particularly divergent radiation emitted, for example, by a semiconductor chip which has been applied to the chip mounting surface from entering the optical element.

The thickness and composition of the reflective layer or layers may advantageously be matched to the optoelectronic component which is to be mounted in the housing. In this case it is possible, for example, for the coating to be colour-optimized and to particularly successfully reflect light of a specific wavelength.

It is particularly advantageous for optical element and carrier to be produced separately, since during coating there is no need to take any precautions against the chip mounting surface or the interconnects on the carrier being covered with electrically insulating or electrically conductive material, as is the case, for example, when using a single-piece housing.

According to at least one embodiment of the housing, the optical element contains a material which is suitable for producing bonding between the optical element and a potting material which at least partially surrounds the chip mounted on the chip mounting surface, for example. The material may be applied as a thin film to the inner walls of the optical element arranged after the chip mounting region. If the potting compound contains silicone, for example, a coating which contains silicon dioxide is particularly suitable for increasing the bonding of the potting compound to the optical element. By way of example, the silicate layer is applied to the inner walls of the optical element by means of flame pyrolysis.

According to at least one embodiment of the housing for an optoelectronic component, it is possible for the optical element to contain a luminescence conversion material. The luminescence conversion material is suitable for converting wave lengths of at least part of the electromagnetic radiation which is emitted for example by a semiconductor chip which has been applied to the chip mounting surface. For this purpose, the luminescence conversion material contains at least one type of phosphor particles. By way of example, inorganic phosphors, such as rare earths, doped garnet, or organic phosphors, such as perylene phosphors, are particularly suitable. Other suitable phosphors are listed, for example, in document WO 98/12 757, the content of disclosure of which, in respect of the phosphors is hereby incorporated by reference.

With the aid of the luminescence conversion material, it is possible to generate visible light with a desired colour locus on the CIE chromaticity diagram, in particular white light, either by substantially complete conversion of a primary radiation or by targeted partial conversion and mixing of primary radiation and converted radiation.

The luminescence conversion material may, for example, be applied to the inner walls of the optical element as a thin film. In this case, the luminescence conversion layer advantageously contains a luminescence conversion material/matrix mixture. The matrix contains, for example, thermosetting polymers or silicon. The luminescence conversion material may be applied in a substantially uniform concentration for example to the inner walls of the optical element. However, it is also possible for the concentration of luminescence conversion material to be higher in defined regions of the optical element and lower in other regions of the optical element. Moreover, it is possible for the optical element to have regions which do not contain any luminescence conversion material.

Defined conversion of the electromagnetic radiation is achieved by the defined setting of the concentration of luminescence conversion material, for example on the inner walls of the optical element.

In at least one embodiment of the housing, the optical element contains particularly thermally stable materials, such as for example LCP (liquid crystal polymer), PEEK (polyether ether ketone) or PPA (polyphthalamide).

The optical element may in this case be formed, for example, by injection-moulding or transfer-moulding processes. To form a reflective optical system, it is possible, for example, as described above, for the inner walls of the optical element which are arranged after the chip mounting surface to foe coated with a reflective material.

In at least one embodiment of the housing for an optoelectronic component, the optical element is mechanically connected to the carrier by means of at least one press fit. For this purpose, by way of example, at least one recess is provided in the carrier, into which recess there is inserted a pin which is of a slightly larger size than the recess, so that pressing the pin into the recess causes the pin to be mechanically stably connected to the carrier. The pin can then be pressed into a recess in the optical element in the same way. However, it is also possible for the pin to be an integral component of the optical element, i.e. the pin is, for example, produced together with the optical element, for example in a transfer-moulding, injection-moulding or metal-casting process. Moreover, it is conceivable for the pin to be an integral component of the carrier and just the optical element to have a recess in which the pin can engage. It is particularly preferable for the optical element to be mechanically connected to the carrier by means of at least two press-fits, which means that the optical element has, for example, two locating pins, by means of which the optical element can be mechanically secured to the carrier and adjusted relative to the chip.

The recesses may, for example, be bores. However, it is also possible for recesses to foe produced as early as during the production of carrier and/or optical element, for example by using a suitable mould by means of one of the abovementioned processes, such as injection moulding or transfer moulding.

The carrier may, for example, contain at least one of the following materials: LCP, PEEK, PPA, ceramics, such as for example $Al_2O_3$ or AlN. An advantage of the two-part design results from the fact that the carrier material can be selected independently of the material of the optical element. In this way, the carrier material can be optimised with regard to the demands imposed on the carrier.

The invention also describes an optoelectronic component having one of the housings described above.

According to at least one embodiment of the optoelectronic component, the component has at least one light-emitting diode chip, in which a large proportion of the electromagnetic radiation generated in the light-emitting diode chip emerges in the main emission direction through a radiation emission surface. It is particularly preferable for electromagnetic radiation to emerge exclusively through the radiation emission surface.

It is preferable for the light-emitting diode chip to include an epitaxially grown layer stack. The layer stack is, for example, a sequence of epitaxially grown layers. The layer stack, preferably comprises at least one active zone which is suitable for generating electromagnetic radiation. The radiation emission surface is then preferably formed by a main surface of the chip, which extends parallel or substantially parallel to the layers of the layer stack.

For this purpose, the active zone may, for example, have a pn junction, a double hetero structure, a single quantum well structure or particularly preferably a multiple quantum well (MQW) structure.

In the context of the present application, the term quantum well structure also encompasses any structure in which the energy states of charge carriers are quantized by confinement. In particular, the terra quantum well structure does not imply any stipulation of the dimensionality of the quantizing. It therefore includes, inter alia, quantum wells, quantum wires and quantum dots as well as any combination of these structures.

The layer stack is particularly preferably a sequence of epitaxially grown layers, from which the growth substrate has been removed after the epitaxial growth has ended. It is particularly preferable for a carrier to have been applied to that surface of the layer stack which is remote from the original growth substrate. Components which are produced by removing the growth substrate from an epitaxially grown layer sequence are often also referred to by the generic term thin-film components.

A basic principle of a thin-film component is described, for example, in I. Schnitzer at al., Appl. Phys. Lett. 63 (16), 18 Oct. 1993, pages 2174 to 2176, the content of disclosure of which relating to the basic principle of thin-film components is hereby incorporated by reference.

A thin-film light-emitting diode chip is in close approximation a Lambert surface radiator and is therefore particularly suitable for example for use in a headlamp.

It is particularly advantageous that the carrier of the thin-film component can be selected relatively freely compared to a growth substrate. For example, the carrier may be more suitable for the component with regard to some properties, such as for example conductivity or stability, than available growth substrates which are subject to tight restrictions if high-quality layer sequences are to be epitaxially grown. For example, to obtain high-quality epitaxial layers, the material which is deposited epitaxially for example needs to be lattice-matched to the growth substrate.

The carrier which has been applied to the layer stack is preferably distinguished by a coefficient of thermal expansion which is matched to the layer stack. By way of example, the carrier may contain a semiconductor material, such as germanium, gallium arsenide, gallium nitride, silicon carbide, and ether materials, such as sapphire, molybdenum or metals.

Moreover, the carrier is preferably distinguished by a particularly good thermal conductivity, so that the heat which is produced in the active zone during the generation of electromagnetic radiation can be at least partially dissipated to the environment via the carrier.

According to at least one preferred configuration of the light-emitting diode chip, a mirror layer is arranged between the applied carrier and the layer stack. The mirror layer may, for example, comprise a Bragg mirror or a metal-containing mirror layer. A metal-containing mirror, which may contain, for example, gold, gold-germanium, silver, aluminium or platinum, is distinguished for example by a lower directional dependency of the reflectivity compared to a Bragg mirror. Metal-containing mirrors also allow a higher reflectivity to be achieved than Bragg mirrors.

It is preferable for the light-emitting diode chip to be applied to the chip mounting surface of the carrier. By way of example, the light-emitting diode chip may be soldered to the chip mounting surface or adhesively bonded to it in a thermally stable manner.

In at least one embodiment of the optoelectronic component, the optical element has a light entry opening, through which a large proportion of the electromagnetic radiation generated in the light-emitting diode chip enters the optical system.

The light entry opening is in this case preferably arranged after the radiation emission surface of the light-emitting diode chip, as seen in the main radiation direction. The main radiation direction of the light-emitting diode chip in this case, for example, runs substantially perpendicular to the radiation emission surface.

It is preferable for the light entry opening to have a surface area which is at most double, preferably at most 1.5, particularly preferably at most 1.25 times, the sire of the radiation emission surface of the light-emitting diode chip. Such a small light entry opening of the reflective optical system by way of example allows significant miniaturization of the light-emitting diode arrangement. The two-part housing structure allows the optical system to be positioned very close to the chip. In particular in combination with a light-emitting diode chip of thin-film construction, this leads to an increase in efficiency of the optoelectronic component, since no radiation or scarcely any radiation is lost, for example as scattered radiation, before entry into the optical element.

Moreover, such a small light entry opening is particularly suitable for reducing the solid angle at which the electromagnetic radiation is emitted by the light-emitting diode chip, by means of the optical element, since the cross-sectional area of the beam cone of the emitted radiation is particularly small close to the radiation emission surface of the semiconductor chip. This is advantageous in particular if the component is intended to be suitable for projecting the highest possible radiation intensity onto the smallest possible area.

A further important variable in geometry of optical systems is the etendue, i.e. the radiance. This is the product of the surface area of a light source and the solid angle at which it outputs radiation. Maintaining the etendue has the consequence, inter alia, that the light from a diffuse radiation source, for example a semiconductor light-emitting diode, cannot be concentrated further, i.e. can no longer be diverted onto a surface area of smaller dimensions. It is therefore advantageous if the radiation beam enters the optical element with the smallest possible cross section.

The invention also describes a method for producing an optoelectronic component.

According to at least one embodiment of the process, in a first method step a semiconductor chip is secured to a carrier. The carrier is, for example, a carrier as described above, on the surface of which, for example, interconnects for electrical contact-connection of the chip are provided. The semiconductor chip is preferably a light-emitting diode chip of chin-film construction.

In the subsequent method step, the semiconductor chip is electrically connected to the carrier. This can be done, for example, by die bonding and wire bonding.

In a further method step, an optical element is secured to the carrier. The optical element is preferably one of the optical elements described above. It is particularly preferable for the optical element to be mechanically connected to the carrier by means of at least one press fit. However, it is also possible for the optical element to be secured to the carrier by means of adhesive bonding or soldering. The parting plane between optical element and carrier preferably lies in the plane of the chip mounting surface, i.e. that surface of the carrier on which the chip has been mounted.

An important factor in the method described is that the electrical contact-connection is produced prior to mounting of the optical element. Unlike in the case of components in which carrier and optical element are of single-piece design, the contact-connection can be produced in a particularly simple way, for example by means of wire bonding, since there is sufficient, space for, for example, a wire bonding head. The optical element can subsequently be moved particularly close to the chip and therefore to the radiation emission surface of the chip, since there is no need to keep clear additional space for chip mounting. It is in this way possible to produce light-emitting diode chips with an optimized etendue. This means, for example, that a reflector is only applied to the carrier after the chips have been mounted and contact-connected.

In subsequent method steps, the light-emitting diode chip may also, for example, be at least partially enclosed by a potting compound which, for example, contains an epoxy material and/or a silicone material. The potting compound preferably also wets at least parts of the inner walls of the optical element and of the carrier. It is in this way additionally possible to increase the mechanical holding forces between optical element and carrier.

The housing described here for an optoelectronic component as well as the optoelectronic component itself are explained in more detail below on the basis of exemplary embodiments and the associated figures.

BRIEF DESCRIPTION OF THE DRAWINGS

FIG. 1 shows a diagrammatic sectional illustration of a first exemplary embodiment of the optoelectronic component described here.

FIG. 2 shows a diagrammatic sectional illustration, of a second exemplary embodiment of the optoelectronic component described here.

FIG. 3 shows a diagrammatic sectional illustration of a third exemplary embodiment of the optoelectronic component described here.

In the exemplary embodiments and figures, identical or equivalent components are in each case provided with the same reference designations. The components illustrated as well as the size relationships of the components with respect to one another are not regarded as toeing to scale. Rather, some details of the figures have been exaggerated in order to facilitate understanding.

DETAILED DESCRIPTION OF THE PREFERRED EMBODIMENTS

FIG. 1 shows a diagrammatic sectional illustration of an optoelectronic component described here.

A light-emitting diode chip 1 has been applied to the chip mounting surface 3 of a carrier 7. In this exemplary embodiment, the external electrical terminal part 5a is electrically connected to a thermal terminal part 6, which is secured to the carrier 7. The light-emitting diode chip 1 has, for example, been soldered to the thermal terminal part 6 and is electrically connected via the thermal terminal part 6 to the external electrical terminal part 5a.

The thermal terminal part 6 is preferably shaped in such a way that it can be connected to the carrier 7 in the manner of a rivet. It may also be sufficient to deform individual webs or struts of the terminal part 6 in order to form a pinched connection of sufficient strength between the terminal part 6 and the carrier 7. Alternatively, the connection between terminal part 6 and carrier 7 may be produced, for example, by a soldered join, a welded join or an adhesively bonded join.

The thermal terminal part 6 acts as a heat-conducting element and dissipates the heat generated when the chip 1 is operating to that side of the carrier 7 which is remote from the chip. On that side of the carrier 7 which is remote from the chip 1, the thermal terminal part 6 may, for example, be in thermal contact with a cooling body (not shown) which functions as a heat sink. In this exemplary embodiment, the carrier 7 may, for example, be designed as a leadframe.

In addition, the chip 1 is electrically connected to the external electrical terminal part 5b via a bonding wire 4.

The optical element 2 has been applied to the carrier 7. The optical element 2 may, as described in the general part of the description, be connected or joined to the carrier 7 at a parting plane by means of a press fit, soldering, adhesive bonding or some other joining technique. The parting plane 15 between carrier 7 and optical element 2 in this case lies in the plane of the chip mounting surface 3.

The optical element is, for example, a reflective optical system as described above. The inner walls 14 of the optical element are for this purpose, for example, formed in the manner of a CPC optical system. By way of example, the electromagnetic radiation output by the light-emitting diode chip can be reflected by means of reflection and/or total reflection at the inner walls 14.

The chip 1 may additionally be at least partially surrounded by a porting compound 8. The potting compound 8 on the one hand stabilizes the mechanical connection between carrier 7 and optical element 2 and on the other hand provides mechanical protection for the light-emitting diode chip 1.

A luminescence conversion material 9 which is suitable for at least partial wavelength conversion of the electromagnetic radiation output by the light-emitting diode chip 1 may be incorporated in the potting compound 8. However, it is also possible for the luminescence conversion material to be applied as a thin film to the radiation emission surface of the light-emitting diode chip 1. Furthermore, the luminescence conversion material may be applied as a thin film to the inner walls 14 of the reflector 2.

FIG. 2 shows a diagrammatic sectional illustration of a second exemplary embodiment of the surface-emitting component described here. In this case, a coating 10 has been applied to the inner walls 14, arranged after the light-emitting diode chip 1, of the optical element 2, which coating may contain at least one of the following materials: luminescence conversion material, reflective material, material which is suitable for increasing the bonding between the inner walls 14 of the optical element 2 and the potting compound 8. By way of example, a silicate is suitable for this purpose when using a silicone-containing potting compound 8. It is preferable for the coating 10 to contain a combination of at least two of these materials.

In addition, the potting compound 8 may have a radiation emission surface 8a which has a defined curvature and thereby forms a lens-like additional optical element, as described for example in the general part of the description. Therefore, a defined radiation emission characteristic of the optoelectronic component can be set by means of the refractive index of the potting compound 8 and the curvature of the radiation emission surface 8a.

If the carrier 7 used is a material with a particularly good thermal conductivity, it is also possible to dispense with the use of a separate thermal terminal part 6. In this case, the carrier 7 may, for example, contain a ceramic material.

FIG. 3 shows a diagrammatic sectional illustration of a third exemplary embodiment of the optoelectronic component described here. In this case, the optoelectronic component has been applied, for example, to a circuit board 12. The circuit board 12 is, for example, a printed circuit board (PCB) or a metal core printed circuit board. The component is thermally and electrically connected to the circuit board 12, for example by means of a soldering process. The circuit hoard 12 in this case serves, for example, as a cooling body in the sense of a heat sink for the heat which is dissipated from the light-emitting diode chip 1 via the thermal terminal part 6.

In this exemplary embodiment, an additional optical element 11 is arranged after the radiation emission surface 8a of the potting compound 8, as described for example in the general part of the description. The additional optical element 11 may, for example, be a diffractive, refractive, holographic or Fresnel optical, system, which can be used to set the radiation emission characteristic of the component in a defined way.

In addition, the additional optical element 11 may contain a luminescence conversion material 9 which is suitable for wavelength conversion of the electromagnetic radiation output by the light-emitting diode chip.

FIG. 3 additionally shows pins 13 by means of which the optical element 2 is mechanically stably connected to the carrier 7 by a press fit. The pins 13 may in this case be part of the optical element 2. However, it is also possible for the pins 13 to be separate elements or for the pins 13 to be integral components of the carrier 7. The reflector 2 may in this case be coated as described above.

The invention is in no way restricted by the description based on the exemplary embodiments. Rather, the invention encompasses any novel feature and any combination of features, which in particular includes any combination of features in the patent claims, even if this feature or this combination is not itself explicitly mentioned in the patent claims or exemplary embodiments.

The invention claimed is:

1. A housing for an optoelectronic component, the housing including:
    a carrier with a chip mounting surface, and
    a separately produced optical element configured to be secured to the carrier, the carrier and the optical element adjoined to each other at a parting plane, the parting plane between the carrier and optical element being arranged in the plane of the chip mounting surface,
    wherein the optical element is mechanically connected to the carrier through at least one press fit, and
    wherein the optical element includes at least one member configured to reflect electromagnetic radiation of a predetermined wavelength region.

2. The housing according to claim 1, wherein the optical element is at least partially formed in the style of at least one of the following optical elements: a compound parabolic concentrator (CPC) optical element, a compound elliptical concentrator (CEC) optical element, a compound hyperbolic concentrator (CHC) optical element, and a total internal reflection (TIR) optical element.

3. The housing according to claim 1, wherein the optical element contains a reflective material.

4. The housing according to claim 1, wherein the optical element contains a material configured to produce bonding between inner walls of the optical element and a potting material.

5. The housing according to claim 1, wherein the optical element contains a luminescence conversion material.

6. The housing according to claim 5, wherein a layer of the luminescence conversion material is applied to at least parts of inner walls of the optical element.

7. The housing according to claim 1, wherein the optical element contains at least one of the following materials: aluminium, aluminium oxide, liquid crystal polymer (LCP), polyether ether ketone (PEEK), polyphthalamide (PPA), silicon dioxide, silicon nitride.

8. An optoelectronic component, said optoelectronic component includes a housing according to claim 1 and at least one light-emitting diode chip of thin-film construction.

9. The optoelectronic component according to claim 8, wherein the optical element has a light entry opening, through which a substantial proportion of the electromagnetic radiation generated in the at least one light-emitting diode chip enters, the light entry opening having a surface area equal to at most twice the radiation emission area of the light-emitting diode chip.

10. An optoelectronic component comprising
a housing including
a carrier with a chip mounting surface, and
a separately produced optical element configured to be secured to the carrier, the carrier and the optical element adjoined to each other at a parting plane, the parting plane between the carrier and the optical element being arranged in the plane of the chip mounting surface, and
at least one light-emitting diode chip of thin-film construction comprising:
an epitaxially grown layer sequence which is free from a growth substrate,
wherein the optical element has a light entry opening, through which a substantial proportion of the electromagnetic radiation generated in the at least one light-emitting diode chip enters, the light entry opening having a surface area equal to at most twice the radiation emission area of the light-emitting diode chip.

11. The housing according to claim 1, wherein the press fit comprises at least one pin wherein the pin has an extension in a direction perpendicular to the surface of the carrier facing the optical element which is smaller than the thickness of the carrier.

* * * * *